US012600134B2

(12) United States Patent
Tsutsui et al.

(10) Patent No.: US 12,600,134 B2
(45) Date of Patent: Apr. 14, 2026

(54) METHOD FOR PRODUCING LAMINATES AND METHOD FOR PRODUCING LIQUID DISCHARGE HEADS

(71) Applicant: CANON KABUSHIKI KAISHA, Tokyo (JP)

(72) Inventors: Satoshi Tsutsui, Kanagawa (JP); Kazunari Ishizuka, Shizuoka (JP); Miho Ishii, Kanagawa (JP); Yohei Hamade, Tokyo (JP); Haruka Yamaji, Tokyo (JP); Hikaru Sugimoto, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 1019 days.

(21) Appl. No.: 17/675,208

(22) Filed: Feb. 18, 2022

(65) Prior Publication Data

US 2022/0274407 A1      Sep. 1, 2022

(30) Foreign Application Priority Data

Feb. 26, 2021 (JP) ................................. 2021-029973

(51) Int. Cl.
| | |
|---|---|
| *G03F 7/038* | (2006.01) |
| *B41J 2/16* | (2006.01) |
| *G03F 7/004* | (2006.01) |
| *G03F 7/039* | (2006.01) |

(52) U.S. Cl.
CPC .......... *B41J 2/1631* (2013.01); *G03F 7/0045* (2013.01); *G03F 7/038* (2013.01); *G03F 7/039* (2013.01)

(58) Field of Classification Search
CPC ..... G03F 7/0035; G03F 7/0045; G03F 7/0385
See application file for complete search history.

(56) References Cited

U.S. PATENT DOCUMENTS

| | | | | |
|---|---|---|---|---|
| 4,256,828 | A * | 3/1981 | Smith ................... | C08G 59/62 |
| | | | | 522/146 |
| 5,331,344 | A | 7/1994 | Miyagawa et al. | |
| 2004/0230008 | A1* | 11/2004 | Correll ..................... | C08J 3/243 |
| | | | | 525/327.2 |
| 2015/0197092 | A1* | 7/2015 | Matsumoto ............ | B41J 2/1603 |
| | | | | 216/36 |
| 2016/0091789 | A1* | 3/2016 | Horiuchi ................ | B41J 2/1631 |
| | | | | 430/320 |
| 2020/0209742 | A1 | 7/2020 | Tsutsui et al. | |
| 2021/0221137 | A1 | 7/2021 | Horiuchi et al. | |

FOREIGN PATENT DOCUMENTS

| | | |
|---|---|---|
| JP | 4-216951 A | 8/1992 |
| JP | 2006-251007 A | 9/2006 |
| JP | 2013-80203 A | 5/2013 |
| JP | 2020-104433 A | 7/2020 |

* cited by examiner

*Primary Examiner* — Daborah Chacko-Davis
(74) *Attorney, Agent, or Firm* — Venable LLP

(57) ABSTRACT

A method for producing a laminate of a cured material from a photosensitive resin composition (1) and a photosensitive resin composition (2), wherein the method includes a step of obtaining a laminated material by laminating the composition (2) onto the composition (1); a step of subjecting the laminated material to photoexposure to obtain a photocured material; a step of developing the photocured material to obtain a developed material; and a step of heating the developed material to obtain a laminate, wherein the photoexposure dose required to cure the composition (2) is smaller than the dose required to cure the composition (1), and wherein the composition (1) contains an epoxy resin (1) having a weight-average molecular weight Mw of 5,000 to 600,000, a softening point of at least 140° C., and an epoxy equivalent weight of not more than 2,300.

19 Claims, 5 Drawing Sheets

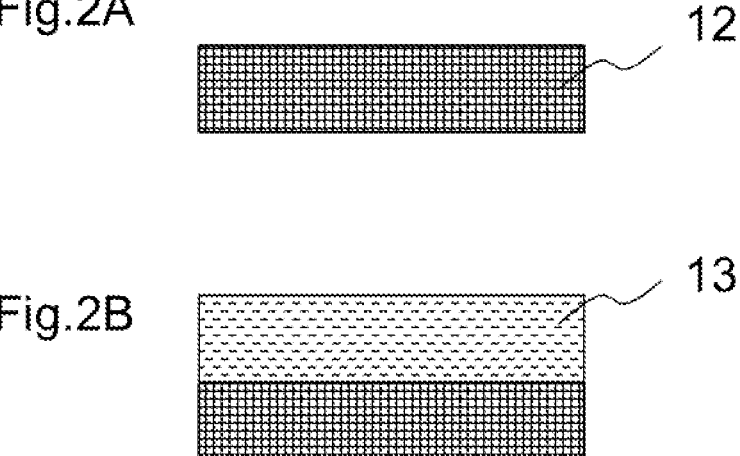
Fig.2A    12
Fig.2B    13

METHOD FOR PRODUCING LAMINATES AND METHOD FOR PRODUCING LIQUID DISCHARGE HEADS

BACKGROUND OF THE INVENTION

Field of the Invention

The present disclosure relates to a method for producing laminates and to a method for producing liquid discharge heads.

Description of the Related Art

Liquid discharge heads, which discharge or eject a liquid, are an example of laminates that are formed using photosensitive resins. Liquid discharge heads are used in liquid discharge devices, e.g., inkjet recording devices, and have a flow channel-formation member and a substrate. The flow channel-formation member is disposed on the substrate and forms a liquid flow channel and, depending on the case, a liquid discharge orifice. The substrate has an energy-generating element on its surface side and, depending on the case, a liquid supply opening and an inorganic material layer are formed. A liquid is supplied from the liquid supply opening to the flow channel, receives energy from the energy-generating element, and is discharged from the liquid discharge orifice to land on a recording medium, e.g., paper.

A method for producing liquid discharge heads is disclosed in Japanese Patent Application Laid-open No. H4-216951. In this method, a lower-sensitivity photosensitive resin layer, which will form a liquid flow channel, is provided on a substrate that has an energy-generating element; pattern-wise photoexposure is performed; a higher-sensitivity photosensitive resin layer, which will form a nozzle section and a discharge orifice, is then additionally provided on the layer of the lower-sensitivity photosensitive resin; pattern-wise photoexposure is performed; and the uncured portions are subsequently removed to form a liquid flow channel, nozzle section, and discharge orifice.

SUMMARY OF THE INVENTION

However, in the method for producing liquid discharge heads described in Japanese Patent Application Laid-open No. H4-216951, due to heating processes, e.g., heat transfer when the higher-sensitivity photosensitive resin layer is laminated to the lower-sensitivity photosensitive resin layer, heat treatment (post exposure bake) after photoexposure of the higher-sensitivity resin layer, and so forth, miscibilization can occur between the laminated photosensitive layers and diffusion of the two compositions can occur. As a result of the occurrence of diffusion of the lower-sensitivity resin layer into the higher-sensitivity resin layer, a sensitivity distribution with a declining sensitivity is produced within the higher-sensitivity resin layer toward the side of the interface where contact with the lower-sensitivity resin layer occurs. When the photoexposure and development steps are then executed, the higher-sensitivity region assumes a more projected-out shape than the shape of the higher-sensitivity resin layer region with relatively lower sensitivity, and there is a concern that an inclination will form in the nozzle section, as shown in FIG. 5, in the higher-sensitivity resin layer that forms the discharge orifice-formation member.

The inclination in the nozzle section thusly formed due to miscibilization between the laminated photosensitive resin layers, is difficult to control with good precision among the individual nozzles in the substrate, and this can be a cause of variation in the precision of discharge by the liquid discharge head. The present disclosure solves this problem. That is, the present disclosure provides a method for producing a laminate and a method for producing a liquid discharge head, that are able to form a nozzle section that has a stable shape.

The present disclosure provides a method for producing a laminate, wherein a method for producing a laminate of a cured material from a photosensitive resin composition (1) and a cured material from a photosensitive resin composition (2), the method comprising:

a step of obtaining a laminated material by laminating the photosensitive resin composition (2) onto the photosensitive resin composition (1);

a step of subjecting the laminated material to photoexposure to obtain a photocured material;

a step of developing the photocured material to obtain a developed material; and a step of heating the developed material to obtain the laminate, wherein the photoexposure dose required to cure the photosensitive resin composition (2) is smaller than the photoexposure dose required to cure the photosensitive resin composition (1), and the photosensitive resin composition (1) contains an epoxy resin (1) having a weight-average molecular weight Mw of 5,000 to 600,000, a softening point of at least 140° C., and an epoxy equivalent weight of not more than 2,300.

Further, the present disclosure provides a method for producing a liquid discharge head, wherein a method for producing a liquid discharge head comprising a substrate, a flow channel-formation member that is disposed on the substrate and forms a liquid flow channel, and a discharge orifice-formation member that is disposed on the flow channel-formation member and has a discharge orifice that discharges a liquid, the method for producing a liquid discharge head comprising:

a step of forming, on the substrate, the flow channel-formation member that forms the liquid flow channel; and a step of forming, on the flow channel-formation member, the discharge orifice-formation member that has the discharge orifice that discharges the liquid, wherein the flow channel-formation member is a cured material from a photosensitive resin composition (1), the discharge orifice-formation member is a cured material from a photosensitive resin composition (2), the photoexposure dose required to cure the photosensitive resin composition (2) is less than the photoexposure dose required to cure the photosensitive resin composition (1), and the photosensitive resin composition (1) contains an epoxy resin (1) having a weight-average molecular weight Mw of 5,000 to 600,000, a softening point of at least 140° C., and an epoxy equivalent weight of not more than 2,300.

The construction described above can provide a method for producing a laminate and a method for producing a liquid discharge head, that are able to form a nozzle section that has a stable shape. Further features of the present invention will become apparent from the following description of exemplary embodiments with reference to the attached drawing.

BRIEF DESCRIPTION OF THE DRAWINGS

FIGS. 2A and 2B are schematic cross-sectional diagrams that show an example of a method for producing a transfer element that has a dry film of the photosensitive resin composition (1);

DESCRIPTION OF THE EMBODIMENTS

Figures 1A, 1B:
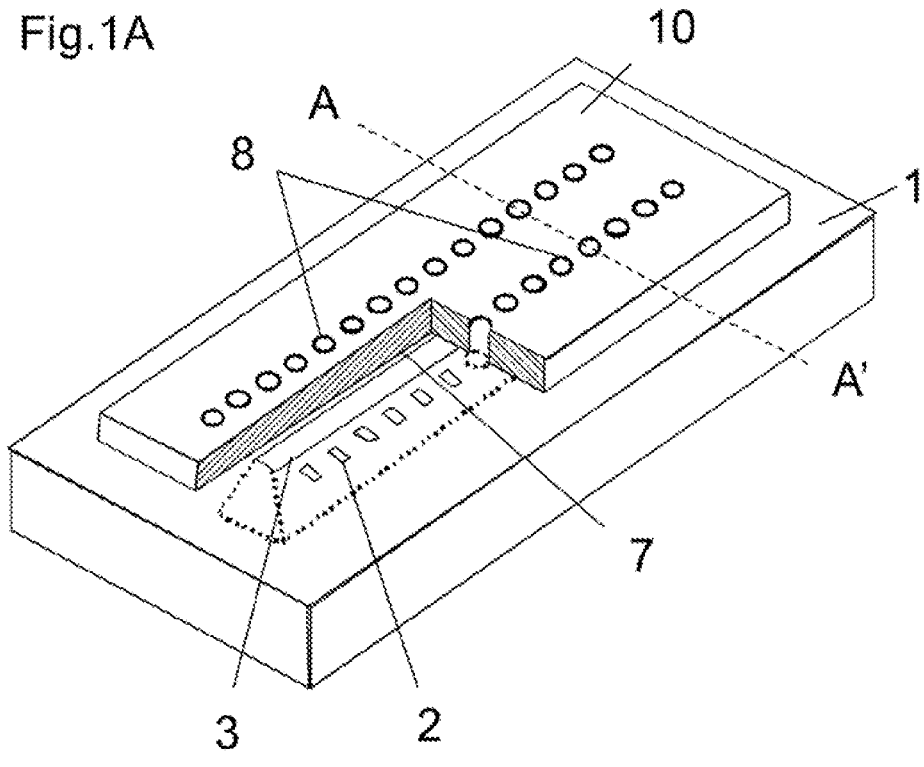
FIG. 1A is a schematic perspective diagram that shows an example of the structure of a laminate (liquid discharge head)
FIG. 1B is a schematic cross-sectional diagram along the A-A' line in FIG. 1A.

Preferred embodiments of the present disclosure are described in the following with reference to the figures. In the description that follows, an example of the application of the laminate production method based on the present disclosure to the production of a liquid discharge head is taken up as an example, but the laminate production method according to the present disclosure is not limited to application to the production of liquid discharge heads.

Further, in the present disclosure, the expression of "from XX to YY" or "XX to YY" indicating a numerical range means a numerical range including a lower limit and an upper limit which are end points, unless otherwise specified.

Also, when a numerical range is described in a stepwise manner, the upper and lower limits of each numerical range can be arbitrarily combined.

Further, in the following description, configurations having the same function may be given the same reference number in the drawings, and the description thereof may be omitted.

The reference numbers in the figures are defined as follows.

1 Substrate
2 Energy-generating element
3 Supply opening
4 Inorganic material layer
5 Protective layer
6 Flow channel-formation member
7 Flow channel
8 Discharge orifice
9 Nozzle section
10 Discharge orifice-formation member
11 Liquid-repellent layer
12 Film
13 Photosensitive resin composition (1)
14 Flow channel-formation mask
15 Photosensitive resin composition (2)
16 Discharge orifice-formation mask
17 Angle of inclination in the nozzle section
20 Substrate surface FIG. 1A is a schematic perspective diagram that shows an example of a laminate (liquid discharge head) according to an embodiment of the present disclosure. FIG. 1B is a schematic cross-sectional diagram on the A-A' line of FIG. 1A. FIG. 1B is thus a schematic cross-sectional diagram of the laminate (liquid discharge head) viewed on a surface perpendicular to the substrate along the A-A' line of FIG. 1A.

The liquid discharge head shown in FIGS. 1A and 1B has a substrate 1 that has an energy-generating element 2 that generates energy in order to effect liquid discharge. The substrate 1 is formed, for example, of silicon. The energy-generating element 2 may be formed at a prescribed pitch on the substrate 1.

There are no particular limitations on the energy-generating element 2, and it can be exemplified by thermoelectric conversion elements and piezoelectric elements. The energy-generating element 2 may be disposed in contact with the surface of the substrate 1 and may be disposed in a partially recessed configuration with respect to the surface of the substrate 1. A control signal input electrode (not shown) for operating the energy-generating element 2 may be connected to the energy-generating element 2. A supply opening 3 that supplies a liquid, e.g., ink, may be opened in the substrate 1. Specifically, for example, tantalum silicon nitride (TaSiN) can be used for the energy-generating element 2. The laminate may not have a substrate and may not have an energy-generating element.

An inorganic material layer 4 and a protective layer 5 are formed on the surface side of the substrate 1. There are no particular limitations on the substrate 1, but it may be, for example, a silicon substrate formed of silicon. The silicon substrate preferably is monocrystalline silicon and the crystalline orientation of the surface is preferably (100). The inorganic material layer 4 preferably contains at least one selection from the group consisting of silicon oxide ($SiO_2$), silicon nitride (SiN), silicon carbide (SiC), silicon carbonitride (SiCN), silicon oxycarbide (SiOC), and metals. The metal is not particularly limited, but can be exemplified by gold (Au), iridium (Ir), tantalum (Ta), titanium (Ti), and so forth. The substrate may or may not have the inorganic material layer and may or may not have the protective layer.

The inorganic material layer 4 in FIGS. 1A and 1B is used as a heat storage layer or insulating layer. The protective layer 5 protects the energy-generating element, and may be formed, for example, of tantalum (Ta) or iridium (Ir). The inorganic material layer 4 may coat the energy-generating element.

The inorganic material layer 4 is formed in FIGS. 1A and 1B over almost the entire surface of the surface (substrate surface 20) of the substrate 1; however, the inorganic material layer 4 may be formed on only a portion of the surface (substrate surface 20) of the substrate 1. A side wall of the flow channel 7 may be formed by the liquid channel-forming flow channel-formation member 6 on the inorganic material layer 4 or on the substrate 1, i.e., the substrate surface 20. In addition, a discharge orifice-formation member 10, which has a discharge orifice 8 that discharges a liquid, is formed disposed on the flow channel-formation member. The discharge orifice-formation member 10 may have a liquid flow channel (nozzle section 9) that communicates with the discharge orifice 8. A liquid-repellent layer 11 is formed on an optional basis on the discharge orifice-formation member 10.

A liquid, e.g., ink, supplied through the flow channel 7 from the supply opening 3, can be discharged by this liquid discharge head as ink droplets from the discharge orifice 8 via the nozzle section 9 through the application of pressure generated by the energy-generating element 2.

An example of the method for producing a laminate (liquid discharge head) is specifically described in the following using FIGS. 2A and 2B and FIGS. 3A to 3H. FIGS.

2A and 2B are schematic cross-sectional diagrams that describes an example of a method for producing a transfer element that has a dry film of the photosensitive resin composition (1). FIGS. 3A to 3H are schematic cross-sectional diagrams that shows an example of the method for producing a laminate (for example, a liquid discharge head). FIGS. 3A to 3H are views seen at the position of the cross section in the completed condition as in FIG. 1B.

First, a film 12 composed of, e.g., polyethylene terephthalate (PET), polyimide, and so forth, is prepared as shown in FIG. 2A. Then, as shown in FIG. 2B, a transfer element having a dry film of the photosensitive resin composition (1) can be fabricated by coating the photosensitive resin composition (1) 13 on the film 12 by, e.g., spin coating, slit coating, and so forth, and carrying out a prebake.

The photosensitive resin composition (1) 13 contains an epoxy resin (1) that has a weight-average molecular weight (Mw) of 5,000 to 600,000, a softening point of at least 140° C., and an epoxy equivalent weight of not more than 2,300. The photosensitive resin composition (1) (13) preferably also contains a photoacid generator and a solvent. The photosensitive resin composition (1) (13) may be a negative photosensitive epoxy resin composition.

The photosensitive resin composition (1) 13 preferably contains a polyhydric alcohol that does not contain a perfluoroalkyl group or perfluoroalkylene group and that has two or three hydroxyl functional groups in terminal position. The composition of the photosensitive resin composition (1) is described in detail below.

The thickness of the dry film of the photosensitive resin composition (1) 13 in the direction perpendicular to the substrate surface 20 corresponds to the flow channel height. The thickness of the dry film of the photosensitive resin composition (1) 13 may be determined as appropriate by the discharge design of the liquid discharge head so as to be larger than the thickness of the dry film of the photosensitive resin composition (2), but, for example, is preferably 3.0 μm to 45.0 μm. The thickness of the flow channel-formation member is preferably 5.0 μm to 40.0 μm.

A specific laminate production method is described in the following, but this should not be taken to mean that the method for producing laminates is limited to or by the following method.

Figures 3A, 3B, 3C, 3D, 3E, 3F, 3G, 3H:
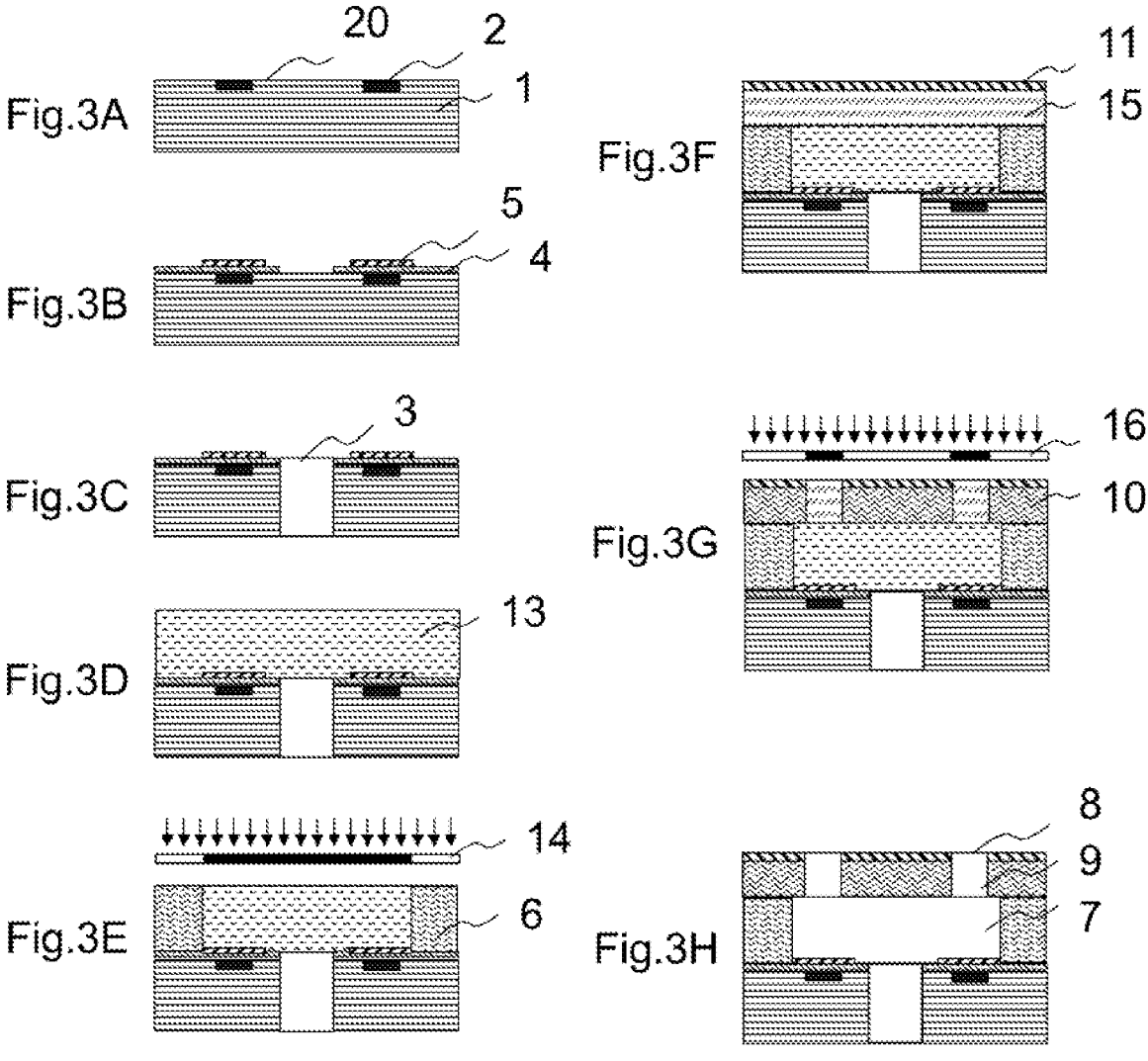
FIGS. 3A to 3H are schematic cross-sectional diagrams that shows an example of a method for producing a laminate (liquid discharge head)

A substrate 1 having an energy-generating element 2 on its surface side is prepared as shown in FIG. 3A. As shown in FIG. 3B, an inorganic material layer 4 is formed on the surface side of the substrate 1 (on the substrate surface 20) so as to cover the energy-generating element 2. A protective layer 5 is also formed over the energy-generating element 2. The inorganic material layer 4 and the protective layer 5 are patterned as necessary.

Then, as shown in FIG. 3C, an ink-supplying supply opening 3 is formed that passes through the substrate. The supply opening 3 is formed in a desired location using wet etching with an alkaline etching solution, e.g., tetramethylammonium hydroxide (TMAH) and so forth, or using dry etching, e.g., reactive ion etching and so forth.

As shown in FIG. 3D, film formation is subsequently carried out by transferring, using a lamination method, the transfer element having the photosensitive resin composition (1) 13 dry film and described in FIGS. 2A and 2B, onto the inorganic material layer 4 of the substrate 1 in which an energy-generating element 2 and supply opening 3 are disposed. This is followed by lamination of the photosensitive resin composition (1) 13 dry film to the substrate 1 by stripping—using, for example, a stripping tape—the film 12 from the transfer element having the photosensitive resin composition (1) 13 dry film.

The method of laminating the photosensitive resin composition (1) 13 to the substrate 1 is not limited to the method of laminating the photosensitive resin composition (1) 13 dry film as described above, and a cured material, for example, a heat-cured material or photocured material, from the photosensitive resin composition (1) 13 may be laminated to the substrate 1. In addition, in the case of a substrate in which a supply opening 3 is not provided, film formation may be carried out by coating the substrate with the photosensitive resin composition (1) by, e.g., spin coating, slit coating, and so forth, without using the transfer element having the photosensitive resin composition (1) dry film. The photosensitive resin composition (1) 13 preferably contains a cationically polymerizable epoxy resin based on considerations such as mechanical strength, stability versus liquids such as inks, resolution, and adherence to the photosensitive resin composition (2) 15 (discharge orifice-formation member 10), vide infra.

Then, as shown in FIG. 3E, a flow channel-formation member 6, which is the cured material from the photosensitive resin composition (1) 13, is formed by photocuring the photoexposed region by performing a pattern-wise photoexposure of the photosensitive resin composition (1) 13 through a flow channel-formation mask 14 having a flow channel pattern, and additionally carrying out a heat treatment (post exposure bake).

The flow channel-formation mask 14 can be, for example, a mask having a light-blocking film, e.g., a chromium film, formed in a pattern, e.g., for the flow channel, on a substrate composed of a material, e.g., glass or quartz, that transmits light at the photoexposure wavelength. The photoexposure device, for example, can be a projection photoexposure device that has a single-wavelength light source, e.g., an i-line photoexposure stepper or KrF stepper, or that has the broad wavelengths of a mercury lamp for its light source, e.g., the Mask Aligner MPA-600 Super (product name, Canon, Inc.).

As shown in FIG. 3F, a laminated material is then obtained by laminating a photosensitive resin composition (2) 15 onto the photocured material from the photosensitive resin composition (1) 13. This is done by coating the photosensitive resin composition (2) 15 onto a film substrate of, e.g., PET, polyimide, and so forth, and carrying out film formation by transfer onto the photosensitive resin composition (1) 13 using a lamination method.

Based on considerations such as mechanical strength, stability versus liquids such as inks, resolution, and adherence to the photosensitive resin composition (1) 13 (flow channel-formation member 6), the photosensitive resin composition (2) 15, which forms the discharge orifice-formation member 10, preferably contains an epoxy resin and more preferably contains a cationically polymerizable epoxy resin.

The thickness of the photosensitive resin composition (2) 15 in the direction perpendicular to the substrate surface 20 may be determined as appropriate by the discharge design of the liquid discharge head, but, for example, is preferably 3.0 μm to 25.0 μm based on a consideration of, inter alia, the mechanical strength. The thickness of the flow channel-formation member is preferably 4.5 μm to 20.0 μm.

A film of a liquid-repellent layer 11 may be formed on the photosensitive resin composition (2) 15 on an optional basis. The water absorbency of the discharge orifice-formation member can be reduced by forming a liquid-repellent layer 11 on the photosensitive resin composition (2) 15. Because liquid repellency versus liquids such as inks is required, a cationically polymerizable perfluoroalkyl composition or perfluoropolyether composition is preferably used for the liquid-repellent layer 11. In the present disclosure, the thickness of this liquid-repellent layer is not added to the thickness of the photosensitive resin composition (2) or the thickness of the discharge orifice-formation member.

It is known that generally the fluorinated alkyl chain in a perfluoroalkyl composition or perfluoropolyether composition segregates to the composition/air interface due to the post-coating baking process, thus enabling an increased liquid repellency by the surface of the composition.

Then, as shown in FIG. 3G, the photosensitive resin composition (2) 15 and the liquid-repellent layer 11 are subjected to pattern-wise photoexposure across a discharge orifice-formation mask 16 that has a discharge orifice pattern. The photoexposed region is further cured by a heat treatment (post exposure bake) to form a discharge orifice-formation member 10, which is the cured material from the photosensitive resin composition (2) 15, and yield a photocured material.

When photoexposure is carried out using light with the same wavelength as for the photosensitive resin composition (1) 13, the photoexposure dose required for curing the photosensitive resin composition (2) 15 must be smaller than the photoexposure dose required to cure the photosensitive resin composition (1) 13. When the photoexposure dose required to cure the photosensitive resin composition (2) 15 is greater than or equal to the photoexposure dose required to cure the photosensitive resin composition (1) 13, the light passing through the photosensitive resin composition (2) 15 ends up inducing photocuring of the photosensitive resin composition (1) 13 in the process of photoexposure of photosensitive resin composition (2) 15 and the ability to form the flow channel 7 by removing the non-photoexposed regions of the photosensitive resin composition (1) 13 in the development step, see below, is then impaired.

The discharge orifice-formation mask 16 can be, for example, a mask having a light-blocking film, e.g., a chromium film, formed in a discharge orifice pattern, on a substrate composed of a material, e.g., glass or quartz, that transmits light at the photoexposure wavelength. The photoexposure device, for example, can be a projection photoexposure device that has a single-wavelength light source, e.g., an i-line photoexposure stepper or KrF stepper, or that has the broad wavelengths of a mercury lamp for its light source, e.g., the Mask Aligner MPA-600 Super (product name, Canon, Inc.).

As shown in FIG. 3H, a developed material is then obtained by developing the obtained photocured material. That is, the uncured regions of the photosensitive resin composition (1) 13, the photosensitive resin composition (2) 15, and the liquid-repellent layer 11 are removed all at once by development using a developer to form the flow channel 7, the discharge orifice 8, and the nozzle section 9.

This is followed by heating the obtained developed material, i.e., subjecting the developed material to a heat treatment (post exposure bake), to obtain the laminate (liquid discharge head). The developer can be exemplified by propylene glycol monomethyl ether acetate (PGMEA), methyl isobutyl ketone (MIBK), xylene, and so forth. A rinse process using, e.g., isopropyl alcohol (IPA), may be carried out on an optional basis.

In the laminate production method described in the preceding, the photosensitive resin composition (2) 15 is laminated onto the photosensitive resin composition (1) 13 after the photosensitive resin composition (1) 13 has undergone photoexposure, but the photosensitive resin composition (2) 15 may be laminated onto the photosensitive resin composition (1) 13 before the photosensitive resin composition (1) 13 has been subjected to photoexposure. That is, the step of obtaining the laminated material is not limited to a procedure in which the photosensitive resin composition (2) 15 is laminated onto the photocured material from the photosensitive resin composition (1) 13, and the laminated material may be obtained by laminating the photosensitive resin composition (2) 15 onto the undried photosensitive resin composition (1) 13, the dry film of the photosensitive resin composition (1) 13, or a thermally cured material from the photosensitive resin composition (1) 13.

The flow channel-formation member 6 and the discharge orifice-formation member 10 are formed from two layers in the laminate production method described in the preceding, but the present disclosure is not limited to or by this embodiment. A structure with three or more layers may be executed using a plurality of photosensitive resin compositions, and the flow channel-formation member and/or the discharge orifice-formation member may be formed using a plurality of photosensitive resin compositions.

The photosensitive resin compositions are described in the following. The photosensitive resin composition (1) contains an epoxy resin that has a weight-average molecular weight (Mw) of 5,000 to 600,000, a softening point of at least 140° C., and an epoxy equivalent weight of not more than 2,300 (an epoxy resin that satisfies all three of these conditions is also referred to as "epoxy resin (1)" in the following). The content of this epoxy resin (1) in the dry film from the photosensitive resin composition (1) is preferably from 20 mass % to 90 mass % and is more preferably from 25 mass % to 80 mass %. The photosensitive resin composition (1) may contain an epoxy resin other than the epoxy resin (1).

When the laminate according to the present disclosure is applied to a liquid discharge head that is provided by the thermal transfer and lamination of a photosensitive rein composition onto a substrate, the incorporation of this epoxy resin (1) in the photosensitive resin composition (1) provides it with resistance (heat resistance) versus the heating steps in the liquid discharge head production process and the pattern shape of the nozzle section of the discharge orifice-formation member is stable. Specifically, even upon the execution of heating steps, e.g., heating during the transfer lamination of the photosensitive resin composition (2) having a higher sensitivity than the photosensitive resin composition (1), post-exposure heat treatment (post exposure bake), and so forth, the occurrence of diffusion of the two compositions between the laminated photosensitive resin compositions (1) and (2) can be prevented.

When the weight-average molecular weight (Mw) of the epoxy resin (1) is less than 5,000 and/or when the softening point of the epoxy resin (1) is less than 140° C., diffusion of the two compositions between the laminated photosensitive resin layers can be brought about by heating steps, e.g., heating during the transfer lamination of the photosensitive resin composition (2) 15 having a higher sensitivity than the photosensitive resin composition (1), post-exposure heat treatment (post exposure bake), and so forth. When, on the other hand, the weight-average molecular weight (Mw) of the epoxy resin (1) is greater than 600,000, the crosslink density of the photosensitive resin composition (1) undergoes a substantial decline and the stability of the pattern shape declines. In addition, which the epoxy equivalent weight of the epoxy resin (1) is larger than 2,300, the reactivity declines and the defect appears of the generation of unevenness in the pattern side wall of the cured material.

The epoxy resin (1) should have a weight-average molecular weight (Mw) of 5,000 to 600,000, a softening point of at least 140° C., and an epoxy equivalent weight of not more than 2,300, but is not otherwise particularly limited, and, for example, "jER1009F" and "jER1009SK" from Mitsubishi Chemical Corporation can be used.

The weight-average molecular weight (Mw) of the epoxy resin (1) preferably is 10,000 to 60,000 and more preferably is 20,000 to 30,000. The softening point of the epoxy resin (1) preferably is 140° C. to 200° C. and more preferably is 142° C. to 180° C. The epoxy equivalent weight of the epoxy resin (1) preferably is 1,000 to 2,300 and more preferably is 1,500 to 2,300.

The photosensitive resin composition (1) preferably is a cationically polymerizable epoxy resin composition based on such considerations as the adhesive performance of its cured material, mechanical strength, ability to resist liquids (inks), swelling resistance, reactivity as a photolithographic material, resolution, and so forth. More specifically, the photosensitive resin composition (1) preferably contains epoxy resin that has at least one skeleton selected from the group consisting of the phenol novolac skeleton, cresol novolac skeleton, norbornene skeleton, terpene skeleton, dicyclopentadiene skeleton, oxycyclohexane skeleton, and bisphenol skeletons, e.g., bisphenol A type, bisphenol F type, and so forth. When epoxy resin contained by the photosensitive resin composition (1) has such a skeleton, the cured material from the photosensitive resin composition (1) is adapted to providing the desired characteristics due its three-dimensional crosslinking.

Viewed from the standpoint of the resolution, the dispersity (Mw/Mn) of the epoxy resin (1), which is the ratio between its weight-average molecular weight Mw and its number-average molecular weight Mn, is preferably less than 3.0. The reactivity of the epoxy resin is enhanced when Mw/Mn is less than 3.0. As a result, the occurrence of a thorough cure of the epoxy resin (1) is facilitated, which inhibits the occurrence of the defect of the generation of unevenness in the pattern side wall of the cured material of the photosensitive resin composition (1) 13 that is produced by elution of the uncured epoxy resin (1) by development. This dispersity is more preferably from 2.0 to 2.8.

The weight-average molecular weight and number-average molecular weight of the epoxy resin (1) can be determined as polystyrene using gel permeation chromatography (for example, from Shimadzu Corporation). The detailed measurement method is described below.

Viewed from the standpoint of reactivity, the photosensitive resin composition (1) 13 preferably contains an at least trifunctional epoxy resin and a difunctional epoxy resin, and this difunctional epoxy resin more preferably is the epoxy resin (1) described above. By having the photosensitive resin composition (1) contain an at least trifunctional epoxy resin, crosslinking then proceeds three dimensionally and the sensitivity as a photosensitive material can be enhanced.

The at least trifunctional epoxy resin preferably has an epoxy equivalent weight of less than 500. When the epoxy equivalent weight of the at least trifunctional epoxy resin is less than 500, this impedes the occurrence of a decline in pattern resolution due to an insufficient sensitivity and impedes the occurrence of reductions in the mechanical strength and/or adhesiveness of the cured material.

The mass blending ratio between the difunctional epoxy resin and the at least trifunctional epoxy resin (difunctional epoxy resin/at least trifunctional epoxy resin) in the photosensitive resin composition (1) 13 is preferably greater than or equal to 0.3 and less than 5.0 from the standpoints of the heat resistance and adhesiveness. This mass blending ratio is more preferably 0.4 to 4.0.

The diffusion of the two compositions between the laminated photosensitive resin layers can be more thoroughly prevented by having the mass blending ratio between the difunctional epoxy resin and the at least trifunctional epoxy resin in the photosensitive resin composition (1) 13 be in the indicated range. A better heat resistance is obtained when this mass blending ratio is greater than or equal to 0.3. When this mass blending ratio is less than 5.0, swelling upon contact with a liquid such as ink is reduced and reductions in the adhesiveness are restrained.

The photosensitive resin composition (1) 13 preferably contains a polyhydric alcohol from the standpoint of the adhesiveness with the inorganic material layer 4, and this polyhydric alcohol is more preferably a polyhydric alcohol that has two or three hydroxyl functional groups in terminal position. The incorporation of a polyhydric alcohol having two or three hydroxyl functional groups in terminal position makes it possible to promote the cationic polymerization reaction of the epoxy resin and makes it possible to reduce the stresses in the cured resin material provided by the reaction of the hydroxyl group and the ring-opened epoxy group, and is effective for enhancing the adhesiveness with the inorganic material layer. The polyhydric alcohol preferably has two or three hydroxyl functional groups in terminal position and more preferably has two hydroxyl functional groups in terminal position. When there are two hydroxyl functional groups in terminal position, a large effect is obtained with regard to promoting the cationic polymerization reaction of the epoxy resin, and reductions in the adhesiveness with the inorganic material layer during contact with solvent or ink are also restrained.

In addition, this polyhydric alcohol more preferably does not contain a perfluoroalkyl group or a perfluoroalkylene group. When the polyhydric alcohol does not contain a perfluoroalkyl group or perfluoroalkylene group, this suppresses the occurrence of reductions in adherence with the inorganic material layer due to segregation to the air interface side post-film formation. In addition, when the polyhydric alcohol does not contain a perfluoroalkyl group or perfluoroalkylene group, polyhydric alcohol containing a perfluoroalkyl group or perfluoroalkylene group is then not present segregated to the surface in contact with the inorganic material layer when the photosensitive resin composition (1) is used as a dry film or as a cured material such as a heat-cured material or photocured material, and reductions in the adherence with the inorganic material layer are suppressed.

The photosensitive resin composition (1) 13 more preferably contains a polyhydric alcohol that does not contain a perfluoroalkyl group or perfluoroalkylene group and that has two or three hydroxyl functional groups in terminal position. This polyhydric alcohol particularly preferably has two hydroxyl functional groups in terminal position.

The molecular weight of the polyhydric alcohol present in the photosensitive resin composition (1) is preferably less than 3,000. When this molecular weight is less than 3,000, the proportion for the hydroxyl group equivalent weight within the molecule is then large and the adherence-enhancing effect is also substantially improved. Reductions in the resolution in the role as a photolithographic material are also restrained.

In order to avoid elimination of the polyhydric alcohol during heating processes, i.e., prebakes and PEBs, during laminate production up to the development step, the polyhydric alcohol present in the photosensitive resin composition (1) preferably has a boiling point higher than the temperatures of these heating processes. This boiling point can be, for example, at least 210° C. This boiling point can be, for example, not more than 500° C.

The content of the polyhydric alcohol in the photosensitive resin composition (1), per 100 mass parts of the total mass of all the epoxy resin present in the photosensitive resin composition (1), is preferably 0.5 mass parts to 4.0 mass parts and more preferably is 1.0 mass parts to 3.6 mass parts. When this content is at least 0.5 mass parts, there is then a large enhancing effect with regard to adherence to the inorganic material layer. A content less than or equal to 4.0 mass parts can suppress reductions in the resolution in the role as a photolithographic material.

There are no particular limitations on the photosensitive resin composition (2) 15 as long as the photoexposure dose required to cure this photosensitive resin composition (2) is smaller than the photoexposure dose required to cure the photosensitive resin composition (1), and known photosensitive resin compositions can be used. The photosensitive resin composition (2) 15 preferably contains an epoxy resin, a photoacid generator, and a solvent. Viewed from the standpoint of the mechanical strength of the cured material from the photosensitive resin composition (2), the epoxy resin present in the photosensitive resin composition (2) more preferably is an at least trifunctional epoxy resin. Viewed from the standpoint of reactivity, the epoxy equivalent weight of the epoxy resin present in the photosensitive resin composition (2) is preferably not more than 500 and is more preferably not more than 300.

The following are commercial epoxy resins that can be used in the photosensitive resin composition (1) 13 besides the epoxy resin (1): "Celoxide 2021", "GT-300 series", "GT-400 series", and "EHPE3150" (product names), from the Daicel Corporation; "jER1031S", "jER1004", "jER1007", "jER1009", "jER1010", "jER1256", and "157S70" (product names), from the Mitsubishi Chemical Corporation; "EPICLON N-695", "EPICLON N-865", "EPICLON 4050", "EPICLON 7050", "EPICLON HP-6000", "EPICLON HP-4710", "EPICLON HP-7200 series", "EPICLON EXA-4816" (product names), and "EPDX-MKR1710" (product name), from the DIC Corporation; "Denacol series" (product name) from the Nagase ChemteX Corporation; and "EP-4000 series" (product name) from the ADEKA Corporation. In addition to the preceding epoxy resins, resins that correspond to epoxy resin (1), e.g., "jER1009F", "jER1009SK", and so forth from the Mitsubishi Chemical Corporation, can be used as commercial epoxy resins that can be used for the photosensitive resin composition (2) 15. Two or more types of these epoxy resins can be used together.

The content of the epoxy resin in the dry film of the photosensitive resin composition (2) is preferably 80 mass % to 98 mass %. The photosensitive resin composition (1) and the photosensitive resin composition (2) may contain a photosensitive resin other than epoxy resin.

For example, sulfonic acid compounds, diazomethane compounds, sulfonium salt compounds, iodonium salt compounds, disulfonic-type compounds, and so forth are preferred as photoacid generators that can be incorporated in the photosensitive resin composition (1). Commercial products can be exemplified by "Adeka Optomer SP-170" "Adeka Optomer SP-172", and "SP-150" (product names), from the ADEKA Corporation; "BBI-103" and "BBI-102" (product names) from Midori Kagaku Co., Ltd.; "MPF", "IBCF", "TS-01", and "TS-91" (product names) from Sanwa Chemical Co., Ltd.; "CPI-210", "CPI-300", and "CPI-410" (product names) from San-Apro Ltd.; and "Irgacure 290" (product name) from BASF Japan Ltd. Two or more of these photoacid generators may be used in combination. The content of the photoacid generator in the dry film from the photosensitive resin composition (1) is preferably 2 mass % to 8 mass %.

The same photoacid generators that can be incorporated in the photosensitive resin composition (1) can also be used as photoacid generators that can be incorporated in the photosensitive resin composition (2). The content of the photoacid generator in the dry film from the photosensitive resin composition (2) is preferably 0.1 mass % to 4 mass %.

The type and content of the photoacid generator can be adjusted with the goal of adjusting the photoexposure dose required to cure the photosensitive resin composition (1) or the photosensitive resin composition (2).

A silane coupling agent can also be incorporated in the photosensitive resin composition (1) and/or the photosensitive resin composition (2) with the goal of improving the adhesion performance. There are no particular limitations on the silane coupling agent, and "A-187" (product name) from Momentive Performance Materials Inc. is an example of a commercially available silane coupling agent. The content of the silane coupling agent in the dry film from the photosensitive resin composition (1) is preferably 1.5 mass % to 10.0 mass %. The content of the silane coupling agent in the dry film from the photosensitive resin composition (2) is preferably 0.5 mass % to 3.0 mass %.

A sensitizer such as an anthracene compound, a basic substance such as an amine, an acid generator that generates a weakly acidic substance (pKa=−1.5 to 3.0) such as toluenesulfonic acid, a quenching agent, and so forth can be added with the goal of enhancing the pattern resolution or adjusting the sensitivity (photoexposure dose required for curing). "TPS-1000" (product name) from Midori Chemical Co., Ltd. and "WPAG-367" (product name) from Wako Pure Chemical Industries, Ltd. are examples of commercial acid generators that generate toluenesulfonic acid.

In addition, for example, the "SU-8 series" and "KMPR-1000" (product names) from Kayaku MicroChem Co., Ltd., "TMMR 52000" and "TMMF 52000" (product names) from Tokyo Ohka Kogyo Co., Ltd., and so forth, which are commercially available as negative photoresists, can be used as the photosensitive resin composition (1) or photosensitive resin composition (2).

EXAMPLES

Hereinafter, the present disclosure will be described in detail with reference to Examples and Comparative Examples, but the present disclosure is not limited to the configurations embodied in these Examples. Further, "parts" used in Examples and Comparative Examples means "parts by mass" unless otherwise specified.

Examples of the Production of the Photosensitive Resin Composition (1)

The photosensitive resin compositions (1)-1 to (1)-11 described in Tables 1-1 and 1-2 were prepared by mixing.

TABLE 1-1

| Composition components | Product name | Weight-average molecular weight (Mw) | Dispersity | Epoxy equivalent weight | Softening point (° C.) | 1 Number of parts | 2 Number of parts | 3 Number of parts | 4 Number of parts | 5 Number of parts | 6 Number of parts |
|---|---|---|---|---|---|---|---|---|---|---|---|
| | | Photosensitve resin compositon (1) | | | | | | | | | |
| At least trifunctonal epoxy resin | EPICLON N695 | 3400 | — | 209-219 | 90-100 | 100 | 100 | 100 | 100 | 100 | 100 |
| Difunctonal epoxy resin | jER 1009F | 23000 | 2.8 | 1750-2250 | 144 | 200 | 200 | 40 | 100 | 400 | — |
| | jER 1009SK | 23000 | 2.1 | 1750-2250 | 155 | — | — | — | — | — | 40 |
| Polyhydric alcohol | PEG600 | | | | | — | 7.5 | 2.5 | 5 | 12.5 | — |
| | PEG1000 | | | | | — | — | — | — | — | 2.5 |
| Photoacid generator | CPI-410S | | | | | 3 | 3 | 1.4 | 2 | 5 | 1.4 |
| | SP-172 | | | | | 7.07 | 7.07 | 3.3 | 4.7 | 11.8 | 3.3 |
| Acid generator | TPS-1000 | | | | | 0.9 | 0.9 | 0.42 | 0.6 | 1.5 | 0.42 |
| Silane coupling agent | A-187 | | | | | 10.71 | 10.71 | 10.71 | 10.71 | 10.71 | 10.71 |
| Solvent | PGMEA | | | | | 565.6 | 565.6 | 565.6 | 565.6 | 565.6 | 565.6 |

TABLE 1-2

| Composition components | Product name | Weight-average molecular weight (Mw) | Dispersity | Epoxy equivalent weight | Softening point (° C.) | 7 Number of parts | 8 Number of parts | 9 Number of parts | 10 Number of parts | 11 Number of parts |
|---|---|---|---|---|---|---|---|---|---|---|
| | | Photosensitive resin composition (1) | | | | | | | | |
| At least trifunctional epoxy resin | EPICLON N695 | 3400 | — | 209-219 | 90-100 | 100 | 100 | 100 | 100 | 100 |
| Difunctional epoxy resin | jER 1009F | 23000 | 2.8 | 1750-2250 | 144 | — | — | 200 | — | 500 |
| | jER 1009SK | 23000 | 2.1 | 1750-2250 | 155 | 200 | 400 | — | 200 | — |
| Polyhydric alcohol | PEG600 | | | | | — | — | — | 7.5 | 15.0 |
| | PEG1000 | | | | | 7 | 12.5 | 7.5 | — | — |
| Photoacid generator | CPI-410S | | | | | 3 | 5 | 3 | 3 | 17.6 |
| | SP-172 | | | | | 7.07 | 11.8 | 7.07 | 7.07 | 20.0 |
| Acid generator | TPS-1000 | | | | | 0.9 | 0.9 | 0.9 | 0.9 | 4.28 |
| Silane coupling agent | A-187 | | | | | 10.71 | 10.71 | 10.71 | 10.71 | 21.42 |
| Solvent | PGMEA | | | | | 565.6 | 565.6 | 565.6 | 565.6 | 565.6 |

In the table:
EPICLON N695: DIC Corporation
jER1009F, jER1009SK: Mitsubishi Chemical Corporation
PEG: polyethylene glycol
CPI-410S: San-Apro Ltd.
SP-172: ADEKA Corporation
TPS-1000: Midori Kagaku Co., Ltd.
A-187: Momentive Performance Materials Inc.
PGMEA: propylene glycol monomethyl ether acetate Example 1

Figures 4A, 4B, 4C, 4D, 4E, 4F, 4G, 4H, 4I, 4J:
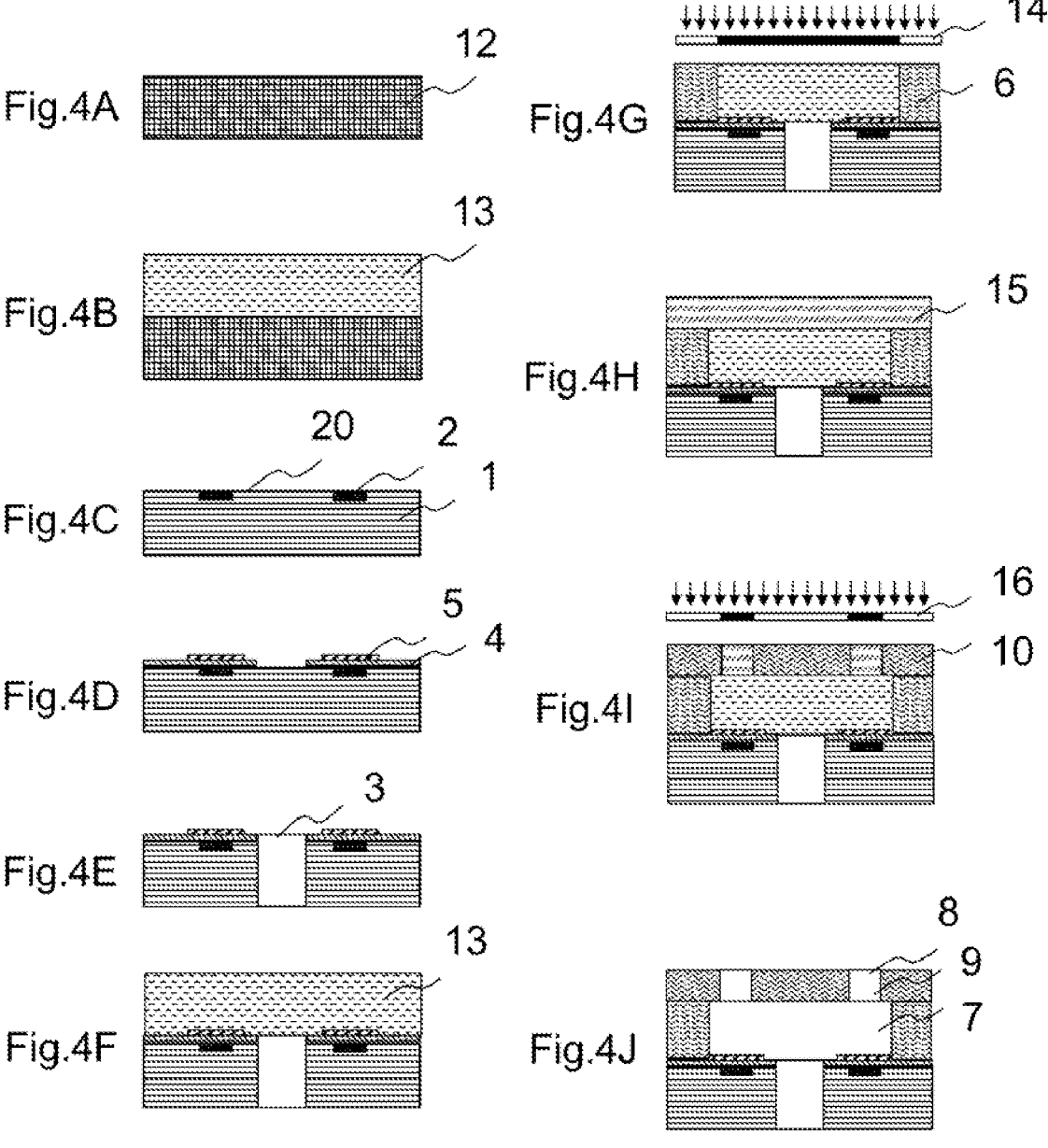
FIGS. 4A to 4J are schematic cross-sectional diagrams that show an example of a method for producing a laminate (liquid discharge head) according to the examples.
Figure 5:
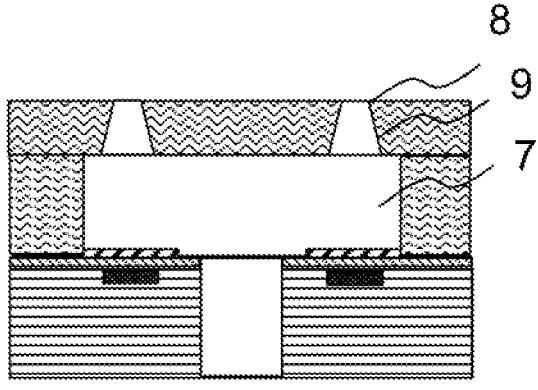
FIG. 5 is a schematic cross-sectional diagram that shows an example of a liquid discharge head according to the prior art.

A 100 μm-thick PET film 12 was first prepared as shown in FIG. 4A. This was followed by the application onto the PET film 12 by spin coating of the photosensitive resin composition (1)-1 (13 in FIG. 4B) described in Tables 1-1 and 1-2, as shown in FIG. 4B; evaporation of the solvent by baking for 20 minutes at 90° C. produced a 15.0 μm film (dry film).

This was followed by the preparation, as shown in FIG. 4C, of a substrate 1 formed of silicon and having, on the surface side, an energy-generating element 2 composed of TaSiN. A 0.3 μm-thick film of SiCN was subsequently formed by plasma CVD, as an inorganic material layer 4, on the surface side of the substrate 1 (substrate surface 20 side) so as to cover the energy-generating element 2, as shown in FIG. 4D. This was followed by the formation of 0.25 μm thick Ta, as a protective layer 5, by sputtering. The inorganic material layer 4 and the protective layer 5 were also patterned using a photolithographic step and reactive ion etching.

A supply opening 3 was then formed as shown in FIG. 4E. The supply opening 3 was formed by forming an etching mask having an opening, using a positive photosensitive resin composed of OFPR (Tokyo Ohka Kogyo Co., Ltd.), and carrying out reactive ion etching through the opening in the etching mask. The reactive ion etching was performed as a Bosch process using an ICP etching device (Alcatel, Model Number: 8E). After the supply opening 3 had been formed, the etching mask was removed using a stripping solution.

A layer of the photosensitive resin composition (1)-1 (13 in FIG. 4F) was then formed as shown in FIG. 4F. Specifically, using a lamination procedure the PET film bearing the photosensitive resin composition (1)-1, fabricated as in FIG. 4B, was transferred while applying pressure and heat at 80° C. onto the substrate 1 in which the energy-generating element 2 and supply opening 3 were disposed. The PET film 12 was then stripped from the photosensitive resin composition (1)-1 using a stripping tape (not shown).

Then, as shown in FIG. 4G, the photosensitive resin composition (1)-1 was pattern-wise exposed, through a flow channel-formation mask 14 having a flow channel pattern, at a photoexposure dose of 16,000 J/m² using an i-line photoexposure stepper (Canon, Inc., product name: i5), and the photoexposed region was cured by additionally carrying out a heat treatment for 5 minutes at 50° C. to form a flow channel-formation member 6, which was the cured material of the photosensitive resin composition (1) (photocured material in this example).

A photosensitive resin composition (2) 15 was subsequently formed as shown in FIG. 4H. First, a photosensitive resin composition (2) 15 composed of the composition components indicated in Table 2 was coated on a 100 μm-thick PET film and a 5.0 μm film (dry film) was formed by evaporating the solvent by baking for 5 minutes at 90° C. Using a lamination procedure, the photosensitive resin composition (2) 15 was then transferred and laminated, while applying heat at 50° C., onto the photosensitive resin composition (1)-1 and the flow channel-formation member 6 to obtain a laminated material.

16 cured material of the photosensitive resin composition (2) (photocured material in this example).

As shown in FIG. 4J, the uncured region of the photosensitive resin composition (1)-1 and the uncured region of the photosensitive resin composition (2) 15 were subsequently collectively removed by development for 1 hour with PGMEA to form a flow channel 7, a discharge orifice 8, and a nozzle section 9 and yield a developed article. The obtained developed article was cured by heating at 200° C. to yield a laminate (liquid discharge head).

Examples 2 to 11

Laminates (liquid discharge heads) according to Examples 2 to 11 were obtained proceeding as in Example 1, but using photosensitive resin compositions (1)-2 to (1)-11 in place of the photosensitive resin composition (1)-1.
Photosensitive Resin Composition (1) Production Example The photosensitive resin compositions (1)-12 and (1)-13 described in Tables 1-1 and 1-2 were prepared by mixing.

Comparative Examples 1 and 2

Laminates (liquid discharge heads) according to Comparative Examples 1 and 2 were obtained proceeding as in Example 1, but using photosensitive resin compositions (1)-12 and (1)-13 in place of the photosensitive resin composition (1)-1.

TABLE 3

| | | Photosensitive resin composition (1) | | | | | |
|---|---|---|---|---|---|---|---|
| Component | Product name | Weight-average molecular weight (Mw) | Dispersity | Epoxy equivalent weight | Softening point (° C.) | 12 Number of parts | 13 Number of parts |
| At least trifunctional epoxy resin | EPICLON N695 | 3400 | — | 209-219 | 90-100 | 100 | 100 |
| Difunctional epoxy resin | jER1007 | 11200 | 3.9 | 1750-2200 | 128 | 40 | — |
| | jER1009 | 23000 | 3.0 | 2400-3000 | 144 | — | 200 |
| Polyhydric alcohol | PEG600 | | | | | 2.5 | 7.5 |
| | PEG1000 | | | | | — | — |
| Photoacid generator | CPI-410S | | | | | 1.4 | 3 |
| | SP-172 | | | | | 3.3 | 7.07 |
| Acid generator | TPS-1000 | | | | | 0.42 | 0.9 |
| Silane coupling agent | A-187 | | | | | 10.71 | 10.71 |
| Solvent | PGMEA | | | | | 565.6 | 565.6 |

TABLE 2

| Composition component | Product name | Number of parts |
|---|---|---|
| Epoxy resin | jER157S70 | 100 |
| Photoacid generator | CPI-410S | 3.8 |
| Silane coupling agent | A-187 | 1.0 |
| Solvent | PGMEA | 140 |

In the table:

jER157S70: Mitsubishi Chemical Corporation

Figure 6:
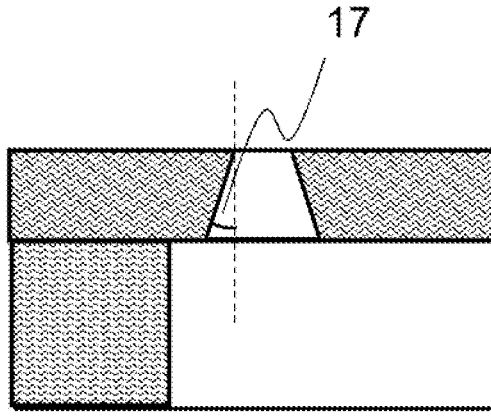
FIG. 6 is a schematic cross-sectional diagram that shows the angle of inclination in the nozzle section of a laminate (liquid discharge head).

Then, as shown in FIG. 4I, the photosensitive resin composition (2) 15 was pattern-wise exposed through a discharge orifice-formation mask 16 having a discharge orifice pattern, at a photoexposure dose of 1,100 J/m² using an i-line photoexposure stepper (Canon, Inc., trade name: i5), and the photoexposed region was cured by additionally carrying out a heat treatment for 5 minutes at 90° C. to form a discharge orifice-formation member 10, which was the Evaluations Discharge Orifice Angle of Inclination Sectioning was carried out so as to traverse the discharge orifice of the obtained laminate (liquid discharge head), and the cross-sectional shape of the discharge orifice was observed at a magnification of 10,000× using a scanning electron microscope (Hitachi, Ltd., product name: S-4800). The shape of the discharge orifice was evaluated by measuring the angle at the location shown by reference number 17 in FIG. 6 as the angle of inclination of the nozzle section. The results of the evaluation are given in Table 4.

Patterning Performance

The patterning performance was evaluated according to the following criteria by observing the pattern side walls of the flow channel-formation member 6, the flow channel 7, and the discharge orifice-formation member 10 of the obtained laminate (liquid discharge head) at a magnification of 5,000× using a scanning electron microscope (Hitachi, Ltd., product name: S-4800). The results of the evaluation are given in Table 4.

Absent: there is no unevenness in the pattern side wall

Present: unevenness is present in the pattern side wall

For the laminates (liquid discharge heads) according to Examples 1 to 11, no unevenness was seen in the pattern side wall, the pattern shape was excellent, and an excellent patterning performance was exhibited.

Evaluation of Printing

An ink composed of ethylene glycol/urea/isopropyl alcohol/N-methylpyrrolidone/black pigment/water=5/3/2/5/3/82 (mass ratio) was filled into the obtained laminate (liquid discharge head); printing was performed in a 30° C./80% RH environment; and the probability of the production of dot printing misdirection was visually evaluated. In the printing test, 100 prints in A4 format were continuously made of the alphabetic character "H" so as to provide a print percentage of 40%. The production of printing misdirection at even one location in the A4 print was scored as "printing misdirection is present", and the probability of production was determined and the print quality was evaluated using the following criteria.

Excellent: probability of production of printing misdirection is less than or equal to 3%

Reduced: probability of production of printing misdirection exceeds 3% such modifications and equivalent structures and functions. This application claims the benefit of Japanese Patent Application No. 2021-029973, filed Feb. 26, 2021, which is hereby incorporated by reference herein in its entirety.

What is claimed is:

1. A method for producing a laminate of a cured material from a photosensitive resin composition (1) and a cured material from a photosensitive resin composition (2), the method comprising:

a step of preparing the photosensitive composition (1) and the photosensitive resin composition (2), where a photoexposure dose required to cure the photosensitive resin composition (2) is less than a photoexposure dose required to cure the photosensitive resin composition (1);

a step of obtaining a laminated material by laminating the photosensitive resin composition (2) onto the photosensitive resin composition (1) while applying heat to the photosensitive resin composition (2);

a step of subjecting the laminated material to photoexposure to obtain a photocured material; and a step of developing the photocured material to obtain a developed material, wherein the photosensitive resin composition (1) contains an epoxy resin (1) having a weight-average molecular

TABLE 4

| | Examples | | | | | | | | | | | Comparative examples | |
|---|---|---|---|---|---|---|---|---|---|---|---|---|---|
| | 1 | 2 | 3 | 4 | 5 | 6 | 7 | 8 | 9 | 10 | 11 | 1 | 2 |
| Photosensitive resin composition (1) | 1 | 2 | 3 | 4 | 5 | 6 | 7 | 8 | 9 | 10 | 11 | 12 | 13 |
| Film thickness (μm) | 15.0 | 15.0 | 15.0 | 15.0 | 15.0 | 15.0 | 15.0 | 15.0 | 15.0 | 15.0 | 15.0 | 15.0 | 15.0 |
| Discharge orifice angle of inclination (°) | 1.4 | 1.6 | 1.9 | 1.7 | 1.5 | 1.8 | 1.5 | 1.4 | 1.5 | 1.4 | 1.4 | 22.0 | 2.2 |
| Patterning performance | Absent | Absent | Absent | Absent | Absent | Absent | Absent | Absent | Absent | Absent | Absent | Absent | Present |
| Print quality | 0% | 0% | 2% | 1% | 0% | 1% | 0% | 0% | 0% | 0% | 0% | 5% | 8% |

The print quality was excellent for the laminates (liquid discharge heads) according to Examples 1 to 11. On the other hand, the laminate (liquid discharge head) according to Comparative Example 1, while having no unevenness in the pattern side walls and exhibiting an excellent patterning performance, had a large angle of inclination in the nozzle section. With the laminate (liquid discharge head) according to Comparative Example 2, unevenness in the pattern side walls was seen and the angle of inclination in the nozzle section was also large. In the laminates (liquid discharge heads) according to Comparative Examples 1 and 2, the print quality was poorer, due to the influence of the variation in the angle of inclination of the nozzle section, than for the laminates (liquid discharge heads) according to Examples 1 to 11.

Thus, as has been described in the preceding, the present disclosure can provide a method for producing laminates in which a nozzle section having a stable shape can be formed, and can provide said laminates.

While the present invention has been described with reference to exemplary embodiments, it is to be understood that the invention is not limited to the disclosed exemplary embodiments. The scope of the following claims is to be accorded the broadest interpretation so as to encompass all weight Mw of 5,000 to 600,000, a softening point of at least 140° C., and an epoxy equivalent weight of not more than 2,300.

2. The method according to claim 1, wherein the photosensitive resin composition (1) additionally contains a photoacid generator and a solvent, and the photosensitive resin composition (2) contains an epoxy resin, a photoacid generator, and a solvent.

3. The method according to claim 1, wherein the photosensitive resin composition (1) contains an at least trifunctional epoxy resin and a difunctional epoxy resin.

4. The method according to claim 3, wherein a mass blending ratio between the difunctional epoxy resin and the at least trifunctional epoxy resin (a mass of the difunctional epoxy resin/a mass of the at least trifunctional epoxy resin) in the photosensitive resin composition (1) is 0.3 to 5.0.

5. The method according to claim 4, wherein the mass blending ratio is 1.0 to 5.0.

6. The method according to claim 4, wherein the mass blending ratio is 2.0 to 5.0.

7. The method according to claim 1, wherein the photosensitive resin composition (1) contains an epoxy resin that has at least one skeleton selected from the group consisting of a bisphenol skeleton, a phenol novolac skeleton, a cresol novolac skeleton, a norbornene skeleton, a terpene skeleton, a dicyclopentadiene skeleton, and an oxycyclohexane skeleton.

8. The method according to claim 1, wherein the photosensitive resin composition (1) contains a polyhydric alcohol that does not contain a perfluoroalkyl group or perfluoroalkylene group and that has two or three hydroxyl functional groups in terminal position.

9. The method according to claim 8, wherein a content of the polyhydric alcohol in the photosensitive resin composition (1) is 0.5 mass parts to 4.0 mass parts per 100 mass parts of a total mass of all the epoxy resin contained in the photosensitive resin composition (1).

10. The method according to claim 8, wherein a content of the polyhydric alcohol in the photosensitive resin composition (1) is 1.0 mass parts to 3.6 mass parts per 100 mass parts of a total mass of all the epoxy resin contained in the photosensitive resin composition (1).

11. The method according to claim 1, wherein the laminate additionally has a substrate that has an energy-generating element, and the method further comprises a step of laminating the photosensitive resin composition (1) onto the substrate.

12. The method according to claim 11, wherein the substrate has an inorganic material layer.

13. The method according to claim 12, wherein the inorganic material layer has at least one selected from the group consisting of silicon oxide, silicon nitride, silicon carbide, silicon carbonitride, silicon oxycarbide, and metals.

14. The method according to claim 11, wherein the substrate has a supply opening.

15. The method according to claim 1, wherein a ratio (Mw/Mn) between weight-average molecular weight Mw and number-average molecular weight Mn of the epoxy resin (1) is less than 3.0.

16. The method according to claim 1, wherein the photosensitive resin composition (1) and the photosensitive resin composition (2) are dry films.

17. The method according to claim 1, wherein a content of the epoxy resin (1) in the photosensitive resin composition (1) is 20 mass % to 90 mass %.

18. The method according to claim 1, wherein the epoxy resin (1) is a difunctional epoxy resin.

19. A method for producing a liquid discharge head, the method comprising:

a step of forming a layer of a photosensitive resin composition (1) to form a flow channel-formation member that forms a liquid flow channel on a substrate;

a step of obtaining a laminate by laminating a layer of a photosensitive resin composition (2) onto the layer of the photosensitive resin composition (1) while applying heat to the photosensitive resin composition (2) for forming a discharge orifice-formation member that is provided on the flow channel-formation member and has a discharge orifice that discharges a liquid;

a step of obtaining a photocured material by exposing the laminate; and a step of forming the flow channel-formation member and the discharge orifice-formation member by developing the photocured material, wherein a photoexposure dose required to cure the photosensitive resin composition (2) is less than a photoexposure dose required to cure the photosensitive resin composition (1), and the photosensitive resin composition (1) contains an epoxy resin (1) having a weight-average molecular weight Mw of 5,000 to 600,000, a softening point of at least 140° C., and an epoxy equivalent weight of not more than 2,300.

* * * * *